(12) United States Patent
Shen et al.

(10) Patent No.: US 6,313,495 B1
(45) Date of Patent: Nov. 6, 2001

(54) STACK CAPACITOR WITH IMPROVED PLUG CONDUCTIVITY

(75) Inventors: Hua Shen, Beacon; Joachim Hoepfner, Poughkeepsie, both of NY (US)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/478,312

(22) Filed: Jan. 6, 2000

Related U.S. Application Data

(62) Division of application No. 09/074,882, filed on May 8, 1998, now Pat. No. 6,046,059.

(51) Int. Cl.[7] .................................................. H01L 29/72
(52) U.S. Cl. .......................... 257/296; 257/300; 257/303; 257/304; 257/306; 257/310
(58) Field of Search ..................................... 257/296, 300, 257/303, 304, 306, 310

(56) References Cited

U.S. PATENT DOCUMENTS 5,828,129 * 10/1998 Roh ...................................... 257/296

* cited by examiner

Primary Examiner—Edward Wojciechowicz
(74) Attorney, Agent, or Firm—Donald B. Paschburg

(57) ABSTRACT

The present invention includes a method of improving conductivity between an electrode and a plug in a stacked capacitor where an oxide has formed therebetween. The method includes the steps of bombarding the oxide with ions and mixing the oxide with materials of the electrode and the plug to increase a conductivity between the electrode and the plug. A method of forming a diffusion barrier within an electrode in a stacked capacitor includes the steps of providing a stacked capacitor having a plug coupled to an electrode and bombarding the electrode with ions to form the diffusion barrier within the electrode such that the diffusion barrier is electrically conductive. A stacked capacitor in accordance with the present invention includes an electrode, a plug for electrically accessing a storage node, the plug being coupled to the electrode and a barrier layer disposed within the electrode for preventing diffusion of materials which reduce conductivity between the electrode and the plug.

13 Claims, 2 Drawing Sheets

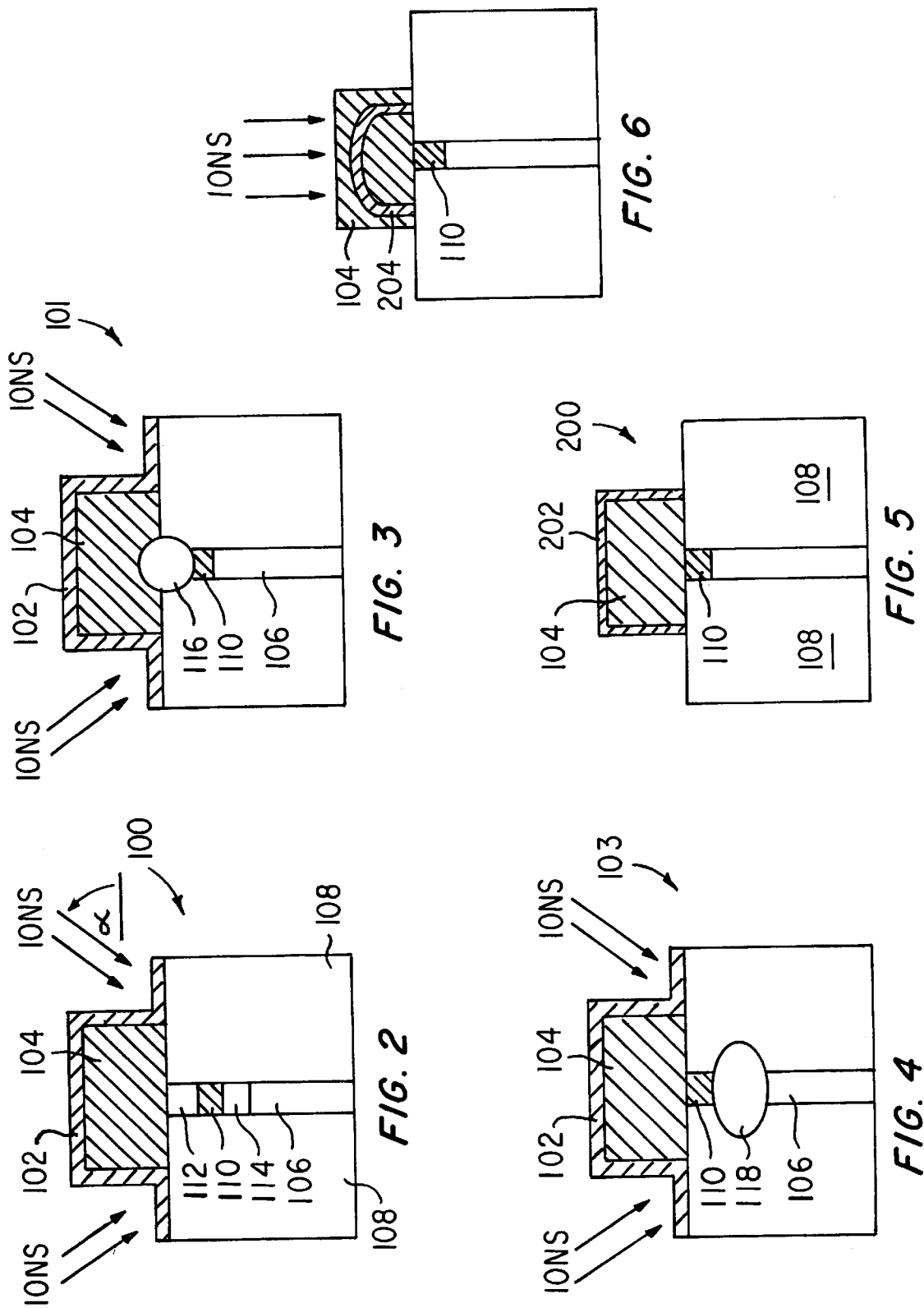

STACK CAPACITOR WITH IMPROVED PLUG CONDUCTIVITY

This is a divisional of application Ser. No. 09/074,882 filed on May 8, 1998 now U.S. Pat. No. 6,046,059 issued Apr. 4, 2000.

BACKGROUND

1. Technical Field

This disclosure relates to stack capacitors for semiconductor devices and more particularly, to a high conductivity plug for stack capacitors.

2. Description of the Related Art

Semiconductor memory cells include capacitors accessed by transistors to store data. Data is stored by as a high or low bit depending on the state of the capacitor. The capacitor's charge or lack of charge indicates a high or low when accessed to read data, and the capacitor is charged or discharged to write data thereto.

Stacked capacitors are among the types of capacitors used in semiconductor memories. Stacked capacitors are typically located on top of the transistor used to access a storage node of the capacitor as opposed to trench capacitors which are buried in the substrate of the device. As with many electrical devices, high conductivity is beneficial for performance characteristics of stacked capacitors.

In semiconductor memories, such as dynamic random access memories (DRAM), high dielectric constant capacitor formation processes include deposition of highly dielectric materials. In one type of high dielectric constant capacitors, a layer of high dielectric constant materials, such as barium strontium titanium oxide (BSTO), is deposited in an oxidized atmosphere.

Referring to FIGS. 1A and 1B, a structure 2 with stacked capacitors is shown. Stacked capacitors 3 include two electrodes a top electrode or storage node 4, usually platinum (Pt) and an electrode 12 separated by a dielectric layer 18. An access transistor 5 includes a gate 6 which when activated electrically couples a bitline 7 through a bitline contact 8 to a plug 14. Plug 14 connects to electrode 12 through a diffusion barrier 16 which stores charge in electrode 12.

A partial view of a conventional stacked capacitor 10 is shown in FIG 1B. Stacked capacitor 10 includes electrode 12, preferably formed of platinum (Pt). Electrode 12 is separated from plug 14 by diffusion barrier 16. Plug 14 is preferably polycrystalline silicon (polysilicon or poly). During processing, dielectric layer 18 is deposited on electrode 12. Dielectric layer 18 is typically a material with a high dielectric constant, for example BSTO. During the deposition of dielectric layer 18, oxide layers 20 and 21 form which are detrimental to the performance of the stacked capacitor. Diffusion barrier 16 is employed to prevent the formation of oxide layer 21.

Oxide layers 20 and 21 form if:
(a) silicon diffuses through diffusion barrier 16 and reacts with oxygen to form oxide 20 between diffusion barrier 16 and electrode 12;
(b) diffusion barrier 16 materials simply react with oxygen; and
(c) oxygen diffuses through diffusion barrier 16 and reacts with plug 14 to form oxide layer 21 between diffusion barrier 16 and plug 14.

Oxide layers 20 and 21 reduce the capacitance of stacked capacitor 10. Therefore, a need exists for improving capacitance of stacked capacitors by eliminating oxide layers adjacent to a barrier layer formed as a result of processing and diffusion. A further need exists for a method of increasing conductivity of a plug used in stacked capacitors.

SUMMARY OF THE INVENTION

The present invention includes a method of improving conductivity between an electrode and a plug in a stacked capacitor where an oxide has formed therebetween. The method includes the steps of bombarding the oxide with ions and mixing the oxide with materials of the electrode and the plug to increase a conductivity between the electrode and the plug.

In particularly useful methods of improving conductivity, the step of bombarding may include the step of bombarding by ion implantation. The step of bombarding may also include the step of bombarding the oxide with germanium ions. The step of bombarding preferably includes the step of adjusting an angle of incident ions to provide for improved mixing. The step of bombarding may further include the step of adjusting an energy and dose of incident ions to provide for improved mixing. The electrode preferably includes platinum, and the plug preferably includes polysilicon.

A method of forming a diffusion barrier within an electrode in a stacked capacitor includes the steps of providing a stacked capacitor having a plug coupled to an electrode, and bombarding the electrode with ions to form the diffusion barrier within the electrode such that the diffusion barrier is electrically conductive.

In alternate methods of forming a diffusion barrier within the electrode, the step of bombarding may include the step of bombarding by plasma doping or by plasma immersion ion implantation. The step of bombarding may include the step of bombarding with nitrogen ions. The step of bombarding may include the step of adjusting an energy and dose of incident ions to provide a location of the diffusion barrier within the electrode. The step of depositing a conductive layer over the electrode may also be included. The electrode may include platinum.

A stacked capacitor in accordance with the present invention includes an electrode, a plug for electrically accessing a storage node, the plug being coupled to the electrode and a barrier layer disposed within the electrode for preventing diffusion of materials which reduce conductivity between the electrode and the plug.

In alternate embodiments of the stacked capacitor, the diffusion barrier includes nitrogen. The diffusion barrier may have a thickness that prevents diffusion and permits electrical conduction therethrough. The diffusion barrier is preferably between about 100 Å and about 500 Å in thickness. An additional diffusion barrier may be included between the plug and the electrode. The additional diffusion barrier may include TaSiN. The electrode may include platinum, and the plug may include polysilicon.

These and other objects, features and advantages of the present invention will become apparent from the following detailed description of illustrative embodiments thereof, which is to be read in connection with the accompanying drawings.

BRIEF DESCRIPTION OF THE DRAWINGS

This disclosure will present in detail the following description of preferred embodiments with reference to the following figures wherein:

FIG. 2 is a cross-sectional view of a stacked capacitor in accordance with the present invention showing ion implantation of oxide layers;

FIG. 3 is a cross-sectional view of a stacked capacitor showing an oxide layer between a diffusion barrier and an electrode mixed in accordance with the present invention;

FIG. 4 is a cross-sectional view of a stacked capacitor showing an oxide layer between a diffusion barrier and a plug mixed in accordance with the present invention;

FIG. 5 is a cross-sectional view of a stacked capacitor showing a diffusion barrier formed on an electrode in accordance with the present invention; and FIG. 6 is a cross-sectional view of a stacked capacitor showing a diffusion barrier formed within an electrode in accordance with the present invention.

DETAILED DESCRIPTION OF PREFERRED EMBODIMENTS

Figure 1A:
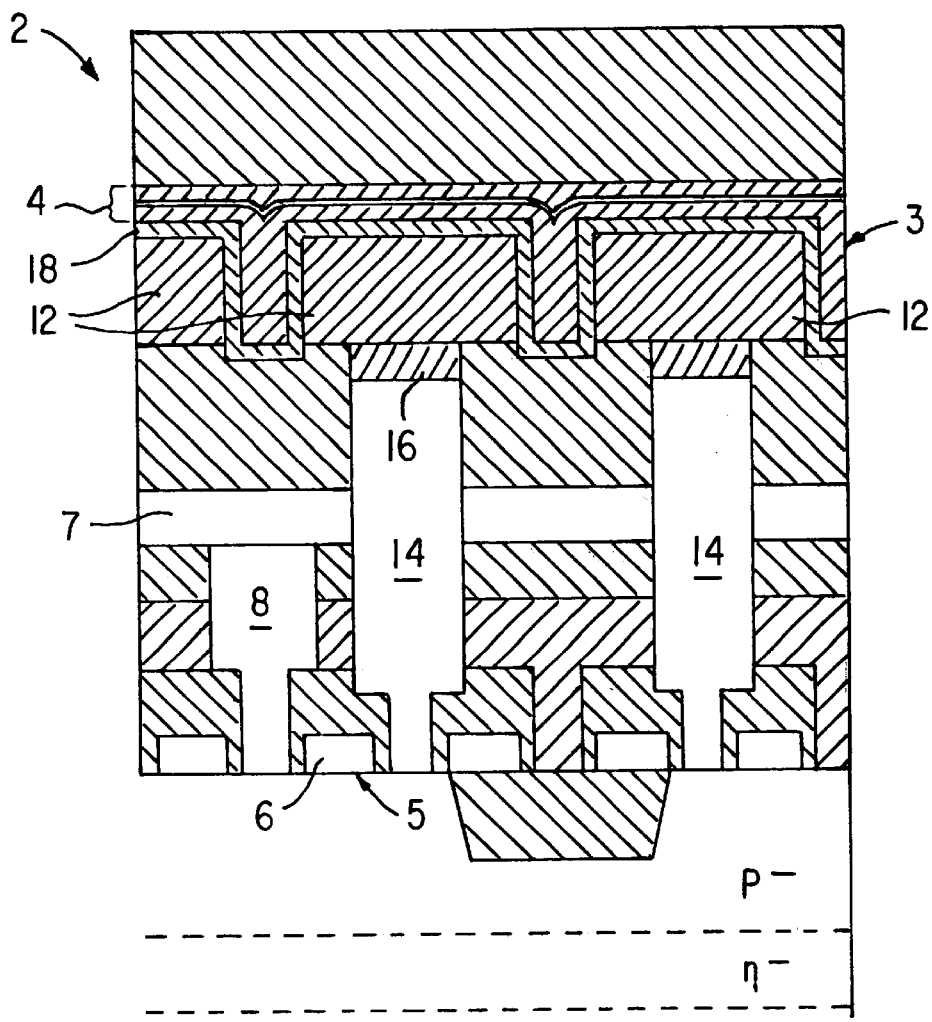
FIG. 1A is a cross-sectional view of stacked capacitors on a semiconductor device in accordance with the prior art.
Figure 1B:
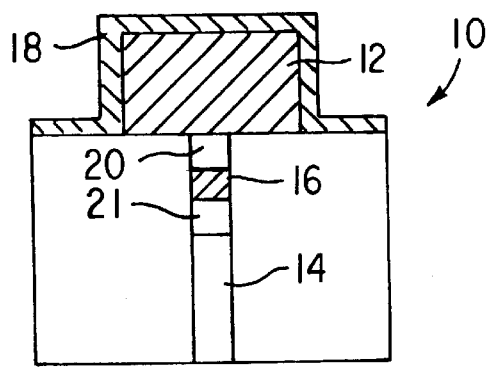
FIG. 1B is a cross-sectional view of a stacked capacitor in accordance with the prior art showing oxide layers formed.

The present disclosure relates to stack capacitors for semiconductor devices and more particularly, to a high conductivity plug for transferring charge to the capacitor electrode. The present invention includes ion implant processes to change an oxide layer into a conductive layer or to form an oxygen diffusion barrier inside an electrode to prevent oxide layers from forming. Changing the oxide layers to conductive layers may be performed using ion implantation (I/I). The oxygen diffusion barrier may be formed using plasma doping (PLAD) or plasma immersion ion implantation (PIII).

Referring now in specific detail to the drawings in which like reference numerals identify similar or identical elements throughout the several views, FIG. 2 shows a stacked capacitor 100 in accordance with one aspect of the present invention. A plug 106 is formed inside a dielectric layer 108. Dielectric layer 108 may include silicon dioxide material. A diffusion barrier 110 is formed at a top portion of plug 106. Diffusion barrier 110 preferably includes TaN, CoSi, TiN, WSi, TaSiN or equivalent materials. An electrode 104 is formed on diffusion barrier 110. Electrode 104 is preferably formed from platinum although other conductive materials such as Iridium (Ir), Ruthenium (Ru) or Ruthenium oxide ($RuO_2$) may be used. A high dielectric constant layer 102 is deposited on electrode 104. High dielectric constant layer 102 is preferably formed from BSTO. BSTO is preferably deposited at high temperatures. However, since high temperatures increase diffusion, BSTO deposition temperatures must be limited to reduce the diffusion of materials, such as oxygen. In the present invention however deposition temperatures for layer 102 may advantageously be increased without degrading performance as explained herein.

During the deposition of layer 102, an oxide layer 112 and/or an oxide layer 114 are formed as described above.

In accordance with the present invention ion implantation is performed to make oxide layers 112 and/or 114 conductive. In a preferred embodiment, germanium (Ge) is implanted into oxide layers 112 and/or 114. Other elements suitable for implantation include Si, C, and/or N. By controlling an angle, α, energy and dose, oxide layer 112 and/or 114 are well mixed with materials adjacent to the respective oxide layers, thereby increasing the conductivity between plug 106 and electrode 104. Even though Ge is an electrically neutral element, Ge bridges the adjacent conductive layers (electrode/diffusion barrier or diffusion barrier/plug) to substantially increase conductivity between plug 106 and electrode 104.

Ion implantation includes bombarding oxide layer 112 and/or 114 with ions having energies between about 30 and about 200 keV, preferably between about 50 and about 150 keV at doses of between about $1 \times 10^{10}$ and about $1 \times 10^{16}$ atoms/cm$^2$, preferably between about $1 \times 10^{14}$ and about $1 \times 10^{15}$ atoms/cm$^2$. In a preferred embodiment ions are introduced at an angle, α, between about 30° and about 60°.

Referring to FIG. 3, a stacked capacitor 101 is shown after ion implantation of Ge into oxide layer 112. A mixed region 116 is formed wherein atoms of adjacent materials such as from electrode 104 and diffusion barrier 110 are mixed together with oxide layer 112 to form a conductive composite thereby increasing the conductivity between electrode 104 and plug 106.

Referring to FIG. 4, a stacked capacitor 103 is shown after ion implantation of Ge into oxide layer 114. A mixed region 118 is formed wherein atoms of adjacent materials such as from diffusion barrier 110 and plug 106 are mixed together with oxide layer 114 to form a conductive composite thereby increasing the conductivity between electrode 104 and plug 106.

In alternate embodiments of the stacked capacitor in accordance with the present invention, a diffusion barrier may be formed on or in the electrode to prevent oxygen and/or silicon from diffusing therethrough. Referring to FIG. 5, a partial stacked capacitor 200 is shown. Stacked capacitor 200 includes a diffusion barrier 202 which is provided and formed on electrode 104. Diffusion barrier 202 inhibits the diffusion of oxygen and silicon therethrough. Barrier 202 is formed prior to high dielectric constant layer 102 deposition (see FIG. 2) where oxygen may be introduced. Barrier 202 may be deposited on the surface of electrode 104 by a chemical vapor deposition process or by PIII or PLAD. In a preferred embodiment, barrier 202 is formed on a surface of electrode 104 to permit improved conductivity between electrode 104 and plug 106 by preventing the diffusion of oxygen to a region between electrode 104 and plug 106. Barrier 202 may be sized to obviate the need for diffusion barrier 110 since diffusing oxygen through dielectric layer 102, deposition is inhibited by barrier 202. In the alternative, barrier 110 may be maintained, however more materials choices are available for the diffusion barrier 110 since oxygen concentration is reduced. For example, a material that is easier to process but has less oxygen diffusion inhibiting properties, may be substituted. For example, TiN may be used.

Referring to FIG. 6, a barrier 204 is formed below the surface of electrode 104. For example, a diffusion inhibiting material, such as nitrogen, may be introduced below the surface of electrode 104 by a PLAD or PIII process. The nitrogen is formed in a thin layer, from about 50 Å to about 150 Å in thickness, preferably from about 70 Å to about 100 Å. In this way, the nitrogen layer functions as a diffusion barrier without degrading conductivity between electrode 104 and plug 106. Barrier 204 may be positioned and sized to obviate the need for diffusion barrier 110 (FIG. 2) since diffusing oxygen from conductive layer 102 deposition is inhibited by barrier 204. In the alternative, barrier 110 may be maintained, however more materials choices are available for the diffusion barrier 110 since oxygen concentration is reduced. In this way, a more easily processed material may be substituted. For example, TiN may be used.

PIII and PLAD include bombarding electrode 104 with ions having energies between 500 eV and about 10 keV, preferably between about 1 keV and about 5 keV, at doses of between about $1 \times 10^{15}$ atoms/cm$^2$ and about $1 \times 10^7$ atoms/ cm², preferably between about $5 \times 10^{15}$ atoms/cm² and about $5 \times 10^{16}$ atoms/cm². Since PIII is an isotropic process and includes three dimensional doping, $\alpha$ is not relevant. PIII is performed at pressures of about 5 mTorr to about 300 mTorr, preferably 20 mTorr to about 100 mTorr.

Having described preferred embodiments for a stack capacitor with improved plug conductivity (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by letters patent is set forth in the appended claims:

What is claimed is:

1. A stacked capacitor comprising:
   a first electrode;
   a plug for electrically accessing the first electrode, the plug being coupled to the first electrode;
   a barrier layer disposed inside material of the first electrode for preventing diffusion of materials which reduce conductivity between the first electrode and the plug; and
   a second electrode separated from the first electrode by a dielectric layer.

2. The stacked capacitor as recited in claim 1, wherein the barrier layer includes a nitrogen layer.

3. The stacked capacitor as recited in claim 2, wherein the barrier layer is between about 50 Å and about 150 Å in thickness.

4. The stacked capacitor as recited in claim 1, wherein the barrier layer has a thickness that prevents diffusion and permits electrical conduction therethrough.

5. The stacked capacitor as recited in claim 1, wherein an additional diffusion barrier is included between the plug and the electrode.

6. The stacked capacitor as recited in claim 5, wherein the additional diffusion barrier is between about 100 Å and about 500 Å in thickness.

7. The stacked capacitor as recited in claim 5, wherein the additional diffusion barrier includes TaSiN.

8. The stacked capacitor as recited in claim 1, wherein the first electrode includes platinum.

9. The stacked capacitor as recited in claim 1, wherein the plug includes polysilicon.

10. A stacked capacitor comprising:
    a first electrode;
    a plug for electrically accessing the first electrode, the plug being coupled to the first electrode;
    a barrier region disposed within the plug for preventing diffusion of materials which reduce conductivity between the first electrode and the plug, the barrier region including a dielectric layer mixed with conductive materials from adjacent conductive regions to permit electrical conduction through the barrier region; and
    a second electrode separated from the first electrode by a capacitor dielectric.

11. The stacked capacitor as recited in claim 10, wherein the barrier region includes at least one of Si, C, N and Ge.

12. The stacked capacitor as recited in claim 10, wherein the barrier region has a thickness that prevents diffusion and permits electrical conduction therethrough.

13. The stacked capacitor as recited in claim 10, wherein an additional diffusion barrier is included between the plug and the electrode.

* * * * *